United States Patent [19]
Inam et al.

[11] Patent Number: 6,038,156
[45] Date of Patent: Mar. 14, 2000

[54] POWER INVERTER WITH IMPROVED HEAT SINK CONFIGURATION

[75] Inventors: Haroon Inam, Seattle; Doris Cronyn, Maple Valley; Edo P. Gebenini, Des Moines; Zhixiang Liang, Kent; Bernie E. Pringle, Kirkland; Gerald E. Rosebrough, Sumner; Raymond L. Zheng, Bellevue, all of Wash.

[73] Assignee: Heart Interface Corporation, Kent, Wash.

[21] Appl. No.: 09/094,422

[22] Filed: Jun. 9, 1998

[51] Int. Cl.[7] .......................... H02M 3/24; H02M 7/538; H05K 7/20; H01L 23/24
[52] U.S. Cl. .......................... 363/133; 363/97; 361/690; 361/710; 257/718; 257/727
[58] Field of Search ........................... 361/690, 704, 361/707, 709, 710; 257/718, 719, 726, 727; 363/133, 95, 97, 21, 24

[56] References Cited

U.S. PATENT DOCUMENTS

| | | | |
|---|---|---|---|
| 3,366,171 | 1/1968 | Scharli | 165/80.3 |
| 3,436,603 | 4/1969 | Vogt | 361/711 |
| 4,266,267 | 5/1981 | Ruegg | 361/717 |
| 4,399,499 | 8/1983 | Butcher et al. | 363/17 |
| 4,466,052 | 8/1984 | Thrap | 363/41 |
| 4,638,404 | 1/1987 | Grossmann et al. | 361/710 |
| 4,639,834 | 1/1987 | Mayer | 361/383 |
| 4,669,028 | 5/1987 | Faa, Jr. | 361/717 |
| 4,707,726 | 11/1987 | Tinder | 174/252 |
| 4,742,441 | 5/1988 | Akerson | 363/97 |
| 4,953,058 | 8/1990 | Harris | 361/383 |
| 5,038,858 | 8/1991 | Jordan et al. | 361/383 |
| 5,184,281 | 2/1993 | Samarov et al. | 361/704 |
| 5,373,433 | 12/1994 | Thomas | 363/43 |
| 5,382,175 | 1/1995 | Kunkel | 361/709 |
| 5,383,092 | 1/1995 | Liberati | 361/704 |
| 5,396,404 | 3/1995 | Murphy et al. | 361/719 |
| 5,444,610 | 8/1995 | Gaudreau et al. | 363/54 |
| 5,504,653 | 4/1996 | Murphy et al. | 361/704 |
| 5,592,021 | 1/1997 | Meschter et al. | 257/727 |
| 5,642,276 | 6/1997 | Lotfi et al. | 363/144 |
| 5,659,461 | 8/1997 | Inou et al. | 363/131 |

*Primary Examiner*—Peter S. Wong
*Assistant Examiner*—Bao Q. Vu
*Attorney, Agent, or Firm*—Christensen O'Connor Johnson & Kindness PLLC

[57] ABSTRACT

An inverter for producing AC power from a DC source is disclosed. The inverter uses a transformer and switches to convert current from a battery or other DC source into AC power that can be used to power household appliances or other devices. The primary windings of the transformer are directly connected to a heat sink to which the switches are mounted with electrical connection between the transformer and switches being via the heat sink. The connection point on the heat sink for the primary windings of the transformer is spatially removed from the locations of the switches to facilitate heat dissipation at both locations. The primary windings of the transformer are formed from a tape or ribbon-like conductor having a cross-sectional area that allows the construction of a relatively compact transformer while also providing primary conductors of relatively large cross section. Use of tape-like conductors in the primary windings significantly simplifies the interconnection of the end of the primary winding both to a bus bar and the heat sink. Since the tape-like conductor of the transformer can be bolted directly to the flat surface of a bus bar or heat sink without using an intermediate terminal or lug, and since a relatively large contact area is established, ohmic contact resistance is minimized thus reducing the generation of heat. In one embodiment, a wedge configuration is used to mount the switches of the primary windings to the heat sink. The mounting wedge includes two flexible plate-like sections that hold both the tab and the body of the switch against the adjoining side wall of the heat sink.

19 Claims, 6 Drawing Sheets

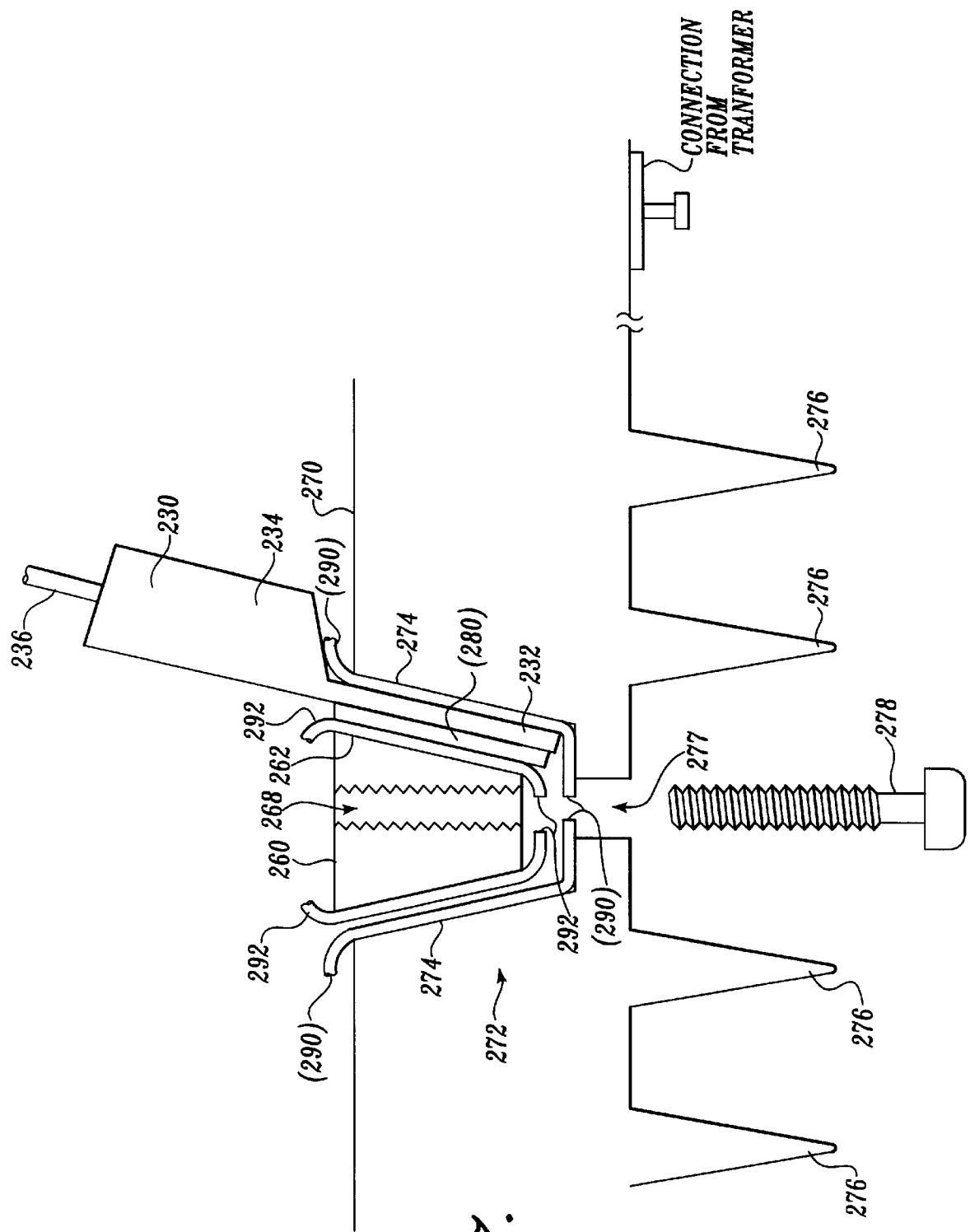

POWER INVERTER WITH IMPROVED HEAT SINK CONFIGURATION

FIELD OF THE INVENTION

The invention relates generally to inverters for producing an AC voltage from a DC input and, more specifically, to an inverter with a heat sink configuration that facilitates efficient thermal dissipation.

BACKGROUND OF THE INVENTION

Inverters create an alternating current (AC) from a direct current (DC) power source. For example, one type of inverter converts a 12 V DC battery voltage to a 120 V AC voltage that will power loads such as common household appliances. Inverters have long been used in environments such as boats, recreational vehicles, or other remote areas where AC power is not otherwise readily available. Inverters can provide power for items such as refrigerators, microwaves, hair dryers, coffee makers, toasters, and so on. Inverters are generally smaller, lighter and less expensive than built-in generators, and produce no noise, no fossil fuel, no vibrations, and no fumes.

An inverter generally works by using a series of switches to produce an AC waveform from a DC source. An example of an exemplary inverter arrangement is shown in U.S. Pat. No. 4,742,441 to Akerson, which discloses a combined inverter and converter (battery charger) arrangement, and which is hereby incorporated by reference. In battery charger mode, the arrangement disclosed by Akerson operates to convert an AC signal (applied to the terminals that serve as the inverter AC output terminals) to a DC battery that powers the inverter. FIG. 1 of the Akerson patent is reproduced as FIG. 1 of the present application.

Referring to FIG. 1, an inverter circuit 10 is generally shown. A battery 12 and an AC element 14 that is powered by the inverter are shown in a typical application of the circuit. The low voltage 12 V DC side of the inverter includes the battery 12, the primary windings 16a and 16b of a transformer 16, and two switches 18 and 20. The battery 12 is connected between DC ground and the center tap of a transformer 16. Transformer 16 has a primary coil on either side 16a and 16b of its center tap 16c. Secondary coil 16d has a turns ratio N relative to each of the primary windings 16a and 16b. One side of the primary coil 16a is connected through switch 18 to ground. The other side of the primary coil 16b is connected through switch 20 to ground. By alternatingly closing switches 18 and 20, an alternating polarity voltage, equal to N times the voltage of the battery 12, is induced in secondary transformer winding 16d.

The remaining circuitry of the inverter comprises the high voltage 120 V AC circuitry that filters the alternating polarity voltage from the secondary winding 16d and provides the filtered AC voltage to the AC element 14. Included on the high voltage 120 V AC circuitry are switching devices 22, 24, 26, and 28 that are connected to the end taps of secondary coil 16d. This array of bi-directional switching devices permits the synchronously controlled operative connection of the secondary coils end taps to lines 30 and 32, connected in turn to input terminals 34a and 34b of inductor 34. By controllably pulse width modulating the sequence closures of switches 22, 24, 26, 28 at a predefined switching frequency and duty cycle, an AC voltage may be impressed across the inductor's input terminals 34a and 34b. An integrated waveform will appear at the output terminals 34c and 34d of the inductor 34. A filter network 36 includes a series connected inductor 38 and capacitor 40, and a series connected inductor 42 and capacitor 44. Through these elements a substantially sinusoidal AC voltage is presented to AC element 14.

Inverters such as those described above must often generate very high currents in the primary windings (such as windings 16a and 16b) of the transformer in order to generate the desired 120 V AC output voltage for the AC element. Depending on the appliances that are being run, it is not uncommon for the desired power output of such inverters to range up to 3,000 watts or more. Further, when operating in the converter (battery charger) mode, devices such as the arrangement disclosed by Akerson can generate current through the primary winding or, windings of ranges up to 200 amps or more. The high current in the primary windings of the inverter generates a significant amount of heat in the primary windings of a conventional wire-wound transformer and an even greater amount of heat in the solid state switches such as switches 18 and 20 that are used to convert the DC battery current into an AC waveform.

It is known in the prior art that the heat generated by various semiconductors, such as power transistors and the like, must be dissipated through an efficient heat sink in order to maintain an acceptable temperature at the transistor junction. Power transistors are packaged in a variety of geometrical configurations; however, the TO-220 package is quite often used. The TO-220 packaging encapsulates the transistor with a relatively thin, rectilinear, molded block or body of electrically nonconductive potting material, such as epoxy or the like. A flat metal mounting tab or plate is also included in and extends from the block to form one side of the package. The metal tab helps dissipate heat from the transistor junction, and is often electrically coupled to one of the transistor pins. The semiconductor so packaged is then normally positioned in a good heat exchange relation with a heat sink to dissipate unwanted heat. A variety of arrangements have existed for mounting such packaged transistors to heat sinks.

One prior art patent that shows a heat sink mounting arrangement for TO-220 type transistors is U.S. Pat. No. 4,707,726 to Tinder. As shown in Tinder, a series of power transistors in TO-220 packages are mounted in a row with their metal tabs extending out from their body portion. The heat sink that is used is an aluminum extrusion having a plurality of parallel cooling fins. A slot or channel is formed in the heat sink between a pair of substantially parallel walls. Once the transistors are lowered into the channel, a spring assembly with fingers pushes the transistors against the wall of the channel. Heat transfer occurs between the transistors and the wall of the heat sink. An electrical insulator is included between the wall and the transistor for electrical insulation, while still allowing heat transfer.

A traditional heat sink configuration, such as that shown in Tinder, in which the heat sink itself is placed adjacent to (but remains electrically insulated from) the switching transistor bodies, is somewhat limiting in the amount of heat that can be dissipated. One of the problems with a heat sink mounting arrangement such as that shown in Tinder is that the simple spring device for holding the transistors does not produce the magnitude of force required for some applications. More specifically, in some instances, 150 to 300 pounds of force must be used to hold the transistors against the heat sink to ensure proper heat transfer.

Also, in inverters where a heat sink configuration such as that shown in Tinder is used, the switching transistor bodies are often coupled directly to the primary transformer wires through the use of a bus bar. The connection points of the transformer wires to the bus bar can generate significant amounts of heat due to the current densities at the connection points and ohmic contact resistance associated with the interconnection of dissimilar metals. This additional heat can hinder the operation of the transistors.

In addition, the installation of transformers in inverters has often required the use of special tools and significant labor. For example, the primary windings of conventional wire-wound transformers used in relatively high power converters are often formed by more than one parallel-connected wire. In many cases, the transformer primary wires require a special crimping tool and significant force for bending and clamping the wires to a conductor of relatively large cross-sectional area that interconnects the transformer to the positive terminal of the battery. Likewise, bending the wires to interconnect the transformer to a relatively distant switching bus bar has also required significant effort and labor.

The present invention is directed to an inverter that overcomes the foregoing and other disadvantages. More specifically, the present invention is directed to an inverter with a transformer-heat sink configuration that simplifies installation while simultaneously providing increased efficiency relative to the dissipation of thermal energy.

SUMMARY OF THE INVENTION

An inverter for producing AC power from a DC source is disclosed. The inverter includes a transformer with primary and secondary windings. A plurality of switches complete a circuit path between the primary windings and the DC source for periodically interrupting the flow of DC current through the primary winding such that a varying current results in the primary winding. The switches that control the current in the primary windings are positioned in a good heat exchange relation with a heat sink to dissipate unwanted heat from the switches. The varying current in the primary windings induces a high voltage varying current waveform in the secondary windings. The high voltage varying current waveform in the secondary windings is used to produce an AC waveform at the output of the inverter, which can be used to power household appliances and other devices.

In accordance with one aspect of the invention, the primary windings of the transformer are electrically connected to the switches through the heat sink. The locations on the heat sink that the primary windings of the transformer are electrically coupled to are spatially removed from the locations of the switches. The spatial distance is advantageous in that any heat that is generated at the junction between the primary windings and the heat sink is distanced from the heat generated by the switches themselves. In addition, the heat dissipation is further assisted by the significant air space and cooling properties of the heat sink. This provides a significant advantage in inverters where overheating of the switches and other components can hinder the operation of the inverter.

In accordance with another aspect of the invention, the primary windings of the transformer are formed from a tape or ribbon-like conductor having a cross-sectional area that allows the construction of a relatively compact transformer while also providing primary conductors of relatively large cross section. Use of tape-like conductors in the primary windings significantly simplifies the interconnection of the end of the primary winding to a bus bar or heat sink. Since the tape-like conductor of the transformer can be bolted directly to the flat surface of a bus bar or heat sink without using an intermediate terminal or lug, and since a larger contact area is thereby created, ohmic contact resistance is minimized thus improving thermal efficiency. In addition, as opposed to transformers using conventional wires that have previously required a special crimping tool and a significant amount of force to mechanically and electrically interconnect multiple wires to the desired mounting position, the simple bolting of the tape-like conductor to the flat surface of a bus bar or heat sink significantly simplifies the installation of the transformer.

In accordance with another aspect of the invention, a wedge configuration is used to mount the switches that are associated with the primary windings to the heat sink. The mounting wedge includes two flexible plate-like sections that hold both the tab and the body of the switch against the adjoining side wall of the heat sink. By using the wedge configuration, the switches may be mounted with a significant amount of pressure so as to ensure a proper electrical connection. The wedge arrangement is especially advantageous as some manufacturers recommend 150–300 pounds of force to assure proper heat transfer to the heat sink. Further, the wedge may be used to secure multiple transistors with nearly equal pressure utilizing only a single screw.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 7 is a side cut-away view of a transistor heat sink and a wedge of FIG. 6.

DETAILED DESCRIPTION OF THE PREFERRED EMBODIMENT

Figure 2:
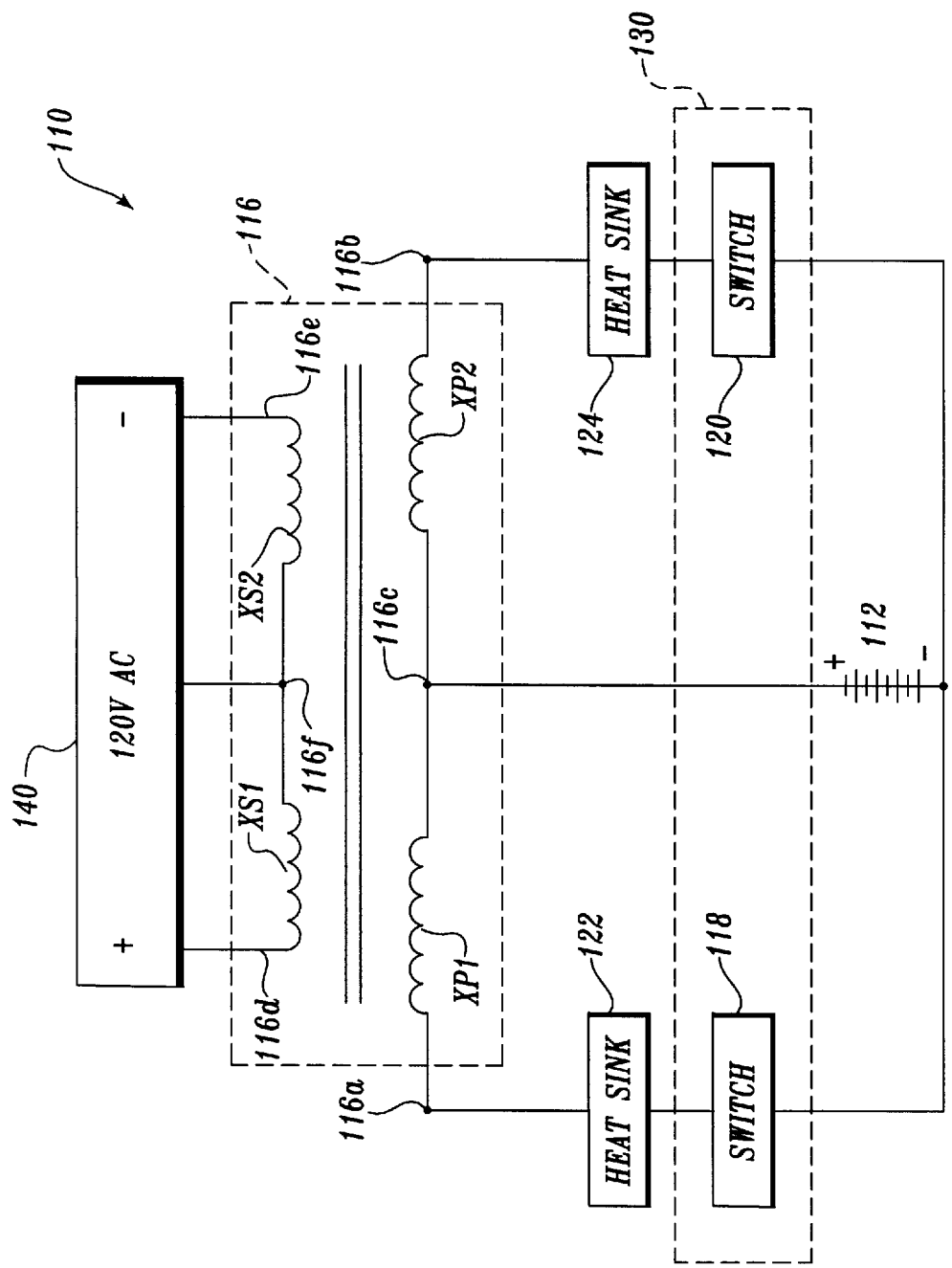
FIG. 2 is a schematic diagram of an inverter formed in accordance with the present invention with an improved transformer-heat sink configuration.

A schematic diagram of an inverter 110 that illustrates the basic arrangement of the present invention is shown in FIG. 2. In the preferred embodiment, the inverter 110 is a combined inverter and converter (battery charger), similar to the device of the previously described Akerson patent. However, upon understanding the invention, those skilled in the art will recognize that the invention can be used in a variety of applications in which primary or secondary windings of a transformer operate at a relatively high power level and are electrically connected to semiconductor switches or other devices that are mounted to a heat sink. As shown in FIG. 2, inverter 110 includes a battery 112, the negative terminal of which is connected to ground and the positive terminal of which is connected to a center tap 116c of the primary windings of a transformer 116. A conductor 116a is wound to form primary winding XP1 of the transformer 116 and a conductor 116b is wound to form primary winding XP2 of transformer 116. The primary side of transformer 116 includes the two primary windings XP1 and XP2 that are connected in series, with the center tap 116c between them. Typically, conductors, 116a and 116b are one or more wires that include an enameled resistive coating. A heat sink 122 and switch 118 are coupled in series between the end of primary winding XP1 (conductor 116a) and ground. A heat sink 124 and a switch 120 are coupled in series between the end of primary winding XP2 (conductor 116b) and ground. Switches 118 and 120 are generally semiconductor devices such as fieldeffect transistors that are included with other components that are mounted on a circuit board 130 in FIG. 2.

On the secondary side of the transformer 116, secondary windings XS1 and XS2 are coupled in series, with a center node wire 116f between them. The ends of secondary windings X51 and X52 (wires 116d and 116e, respectively), and wire 116f are coupled to the 120 V AC circuitry 140. A more detailed example of 120 V AC circuitry was described previously with respect to FIG. 1. The AC element 14 in FIG. 1 is generally an AC load such as a household appliance in the present embodiment.

Figure 1:
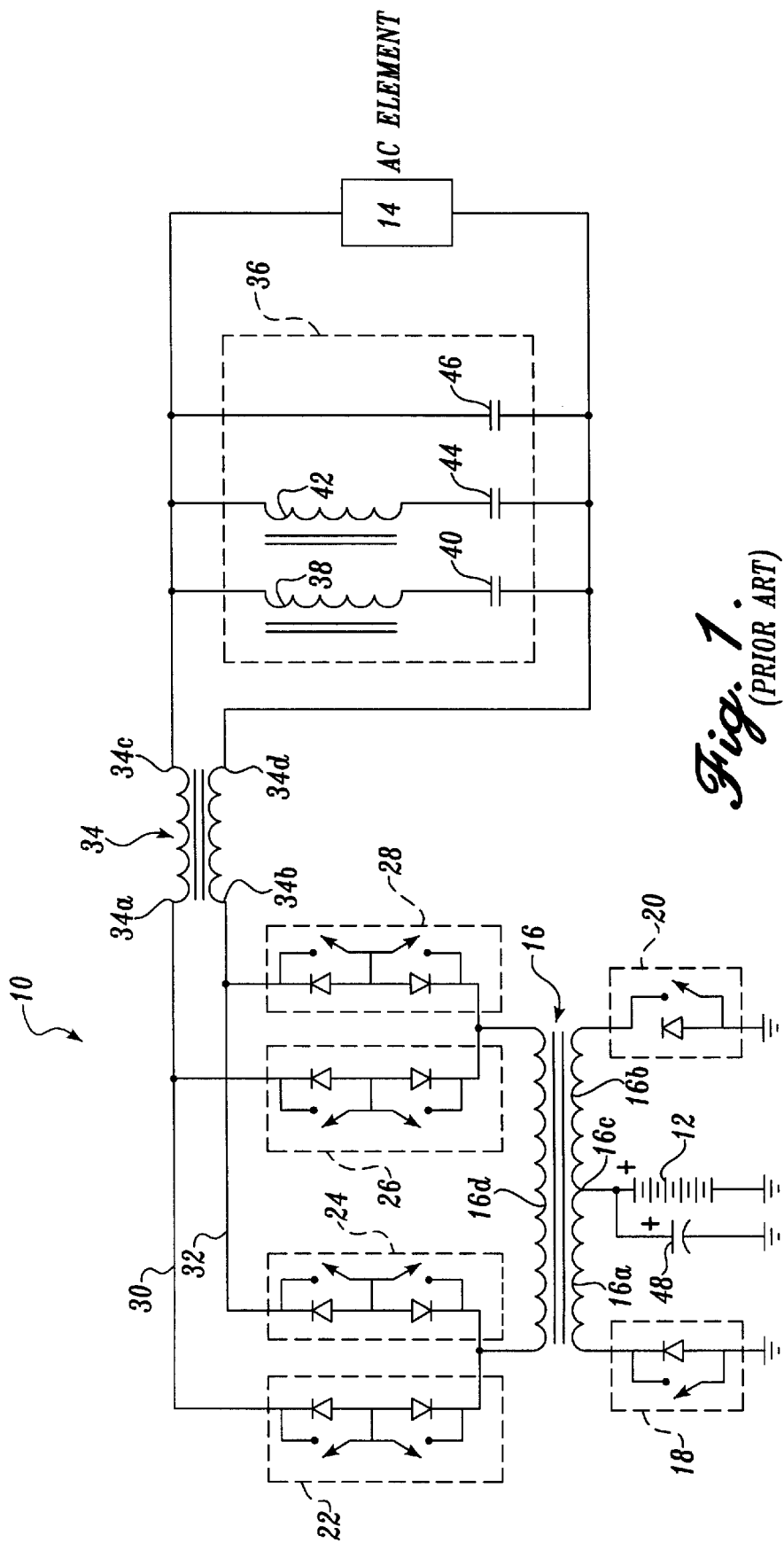
FIG. 1 is a schematic diagram of a prior art circuit illustrating a general inverter configuration.

While both the primary and secondary windings of the transformers shown in FIGS. 1 and 2 include two windings, it will be understood that either or both could have any number of windings. For example, in some applications of the invention, the primary winding includes a winding interconnect with a bridge switching circuit. In addition, while the input power of FIGS. 1 and 2 are shown as being a battery, the input power may be supplied by a variety of sources, including solar-cells or other energy generating means, and may be at 12 V, 24 V, 48 V or other desired voltage levels. Similarly, the output voltage, while generally referred to herein as being 120 VAC-RMS, could be 60 VAC, 90 VAC, 240 VAC, or another selected level.

Figure 3:
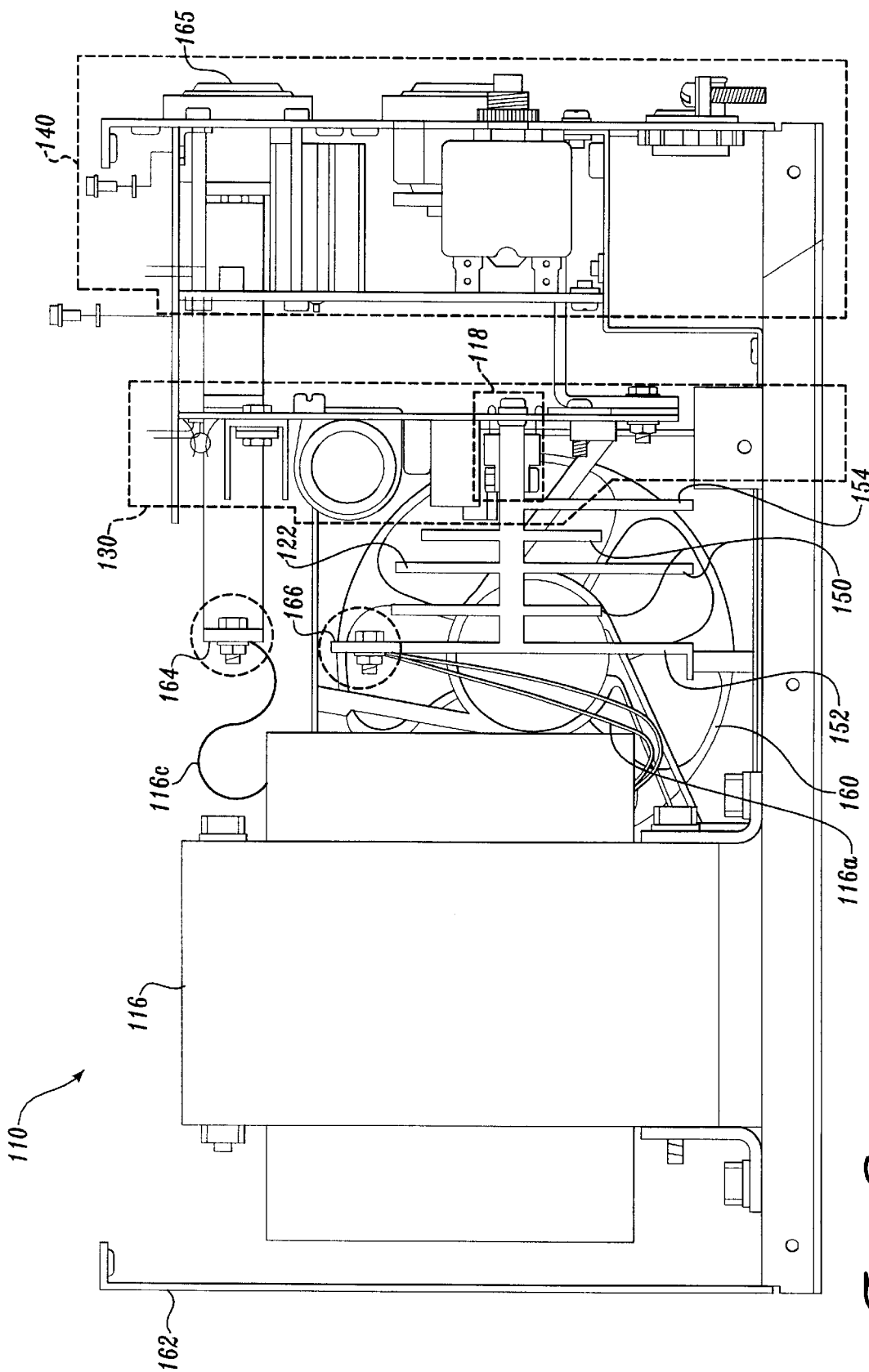
FIG. 3 is a side perspective view of an inverter formed in accordance with the present invention illustrating the improved heat sink configuration.

FIG. 3 shows a side perspective view of an exemplary embodiment of the inverter 110 of FIG. 2. As illustrated in FIG. 3, the low voltage circuitry 130 is contained on a separate circuit board that is mounted in spaced-apart relationship with the high voltage circuitry 140. A chassis or casing 162 is shown to hold the components of the inverter 110. A cooling fan 160 is provided to one side of the inverter 110 for providing cooling air across the cooling fins of the heat sinks 122 and 124. In the depicted arrangement, the two conductors that form primary winding center tap 116c of the transformer 116 are bolted to a bus bar 164, which is electrically interconnected with a connector 165 to which the battery 112 (FIG. 2) is connected. In the preferred embodiments of the invention, the conductors that form the two primary windings of the transformer 116 are a tape or ribbon-like conductor having a cross-sectional area that allows the construction of a relatively compact transformer while also providing primary conductors of relatively large cross section. As opposed to transformers using conventional wires, the use of tape-like conductors in the primary windings significantly simplifies the mounting of the center tap conductor 116c to the bus bar 164. This is in contrast to inverters previously manufactured by the assignee of this invention that have previously required a special crimping tool and a significant amount of force to mechanically and electrically interconnect multiple wires at the center tap of a conventional wire-wound transformer to an electrical conductor such as bus bar 164. The tape-like conductors of the present invention also reduce current density relative to conventional wire-wound transformer primaries, thus lowering the operating temperature of transformer 116.

In the arrangements of FIGS. 2 and 3, the end of primary winding XP1 (conductor 116a) is connected to a cooling fin 150 of heat sink 122 through use of a bolt 166. Again, the use of a tape-like conductor in the primary winding XP1 of the transformer 116 significantly simplifies interconnecting the end of the primary winding XP1 (conductor 116a) to the cooling fin 150. Since a tape-like conductor can be bolted directly to cooling fin 150 without using an intermediate terminal or lug, ohmic contact resistance is minimized, thereby further improving thermal efficiency. The end of primary winding XP2 (tape-like conductor 116b), heat sink 124, and switch 130, which are not shown in FIG. 3, are located on the other side of the inverter 110, and are configured in the same manner as tape-like conductor 116a, heat sink 122, and switch 118. Heat sink 122 includes a number of middle cooling fins 152, and an end cooling fin 154. A set of transistors of the type that can be used for realizing switch 118 include tabs that are mounted to the heat sink 122, at the end near the cooling fin 154. Thus, the tape-like conductor 116a is electrically coupled through the heat sink 122 to the tabs of the transistors in switch 118.

As previously indicated, the coupling of the tabs of transistors in switch 118 to the tape-like conductor 116a through the heat sink 122 has significant advantages over other implementations. In prior arrangements in which a bus bar is used to couple the tabs of the transistors in switch 118 to the conductor 116a, the connection between the conductor 116a and the bus bar forms an ohmic contact that generates significant heat because of relatively high current density at the connection between the bus bar and the conductor 116a. Both the area of contact and the interconnection of dissimilar metals may contribute to such heat generation. This generation of heat at a point near the transistors in addition to the heat generated by the transistors themselves adds to the thermal dissipation problem that can damage or shorten the life of circuit components and adversely affect the operation of the inverter.

In contrast, in the arrangement illustrated in FIG. 3, coupling the conductor 116a to a point on the heat sink 122 that is spatially removed from the transistors of switch 118 does not significantly affect heat dissipation by the transistors of switch 118. In particular, heat generated at the point where the conductor 116a is connected to heat sink 122 is dissipated in view of the significant air space and cooling properties of the heat sink 122. This is especially true in the preferred arrangements of the invention in which conductor 116a is a tape-like conductor that is directly connected to heat sink 122, thereby reducing heat generation at the point of electrical connection. In this manner, the inverter 110 has significantly improved thermal dissipation characteristics, thus providing a compact arrangement in which a greater amount of power can be produced by an inverter 110 of any given size.

In addition to the above-described advantage of the embodiment shown in FIG. 3, the invention can employ an arrangement for heat sink mounting the transistors of the switch 118 (or other semiconductor devices) that further improves thermal efficiency. These transistor mounting arrangements are illustrated in FIGS. 4–7. The heat sinks illustrated in FIGS. 4–7 have a different configuration than the heat sink 122 illustrated in FIG. 3, but may be similarly mounted, although in a more vertical orientation than the heat sink 122. As will be described with respect to FIGS. 5 and 7, the connection point of the tape conductors that form primary winding center tap 116c is flurther displaced from the transistors of switch 118 and is oriented differently than the above-described arrangement of heat sink 122. However, the advantages of improved thermal dissipation created by spatially distancing the connection point of the conductor 116c from the transistors of the switch 118 and using a tape conductor that is directly connected to the heat sink is still present in the embodiments illustrated in FIGS. 4–7.

Figure 4:
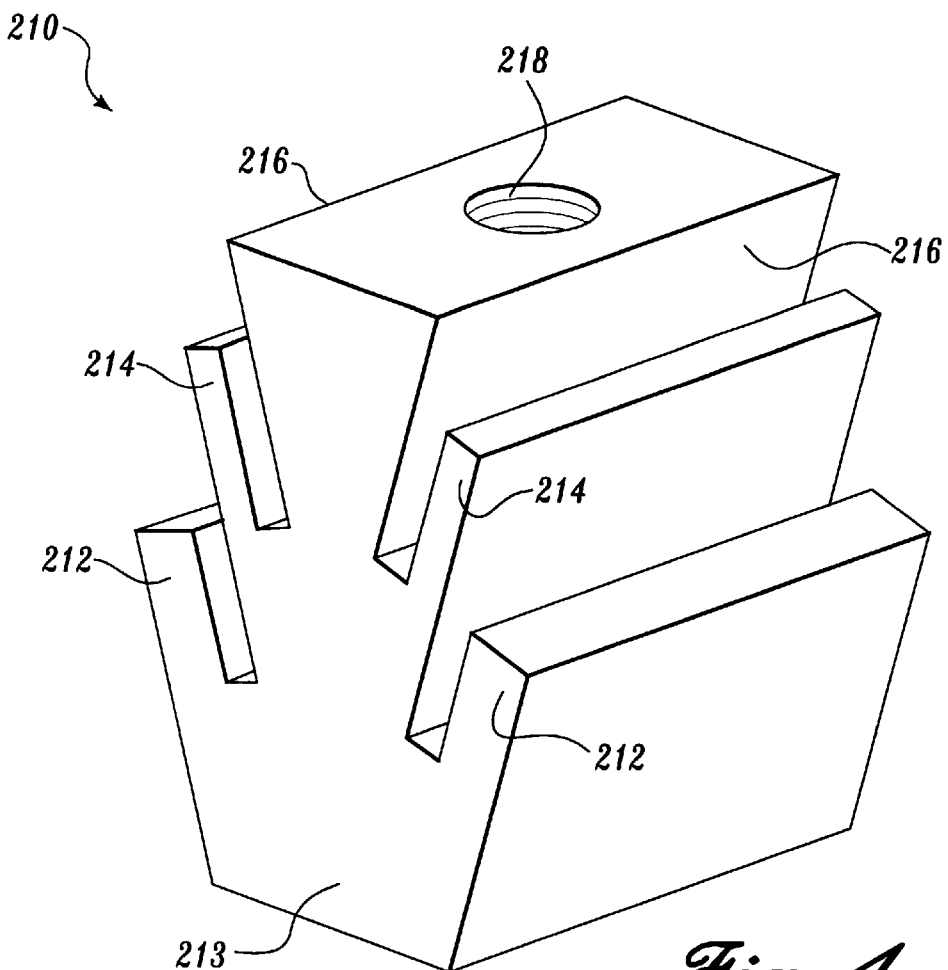
FIG. 4 is a side perspective view of a mounting wedge for use in an alternate embodiment of a heat sink formed in accordance with the present invention.
Figure 5:
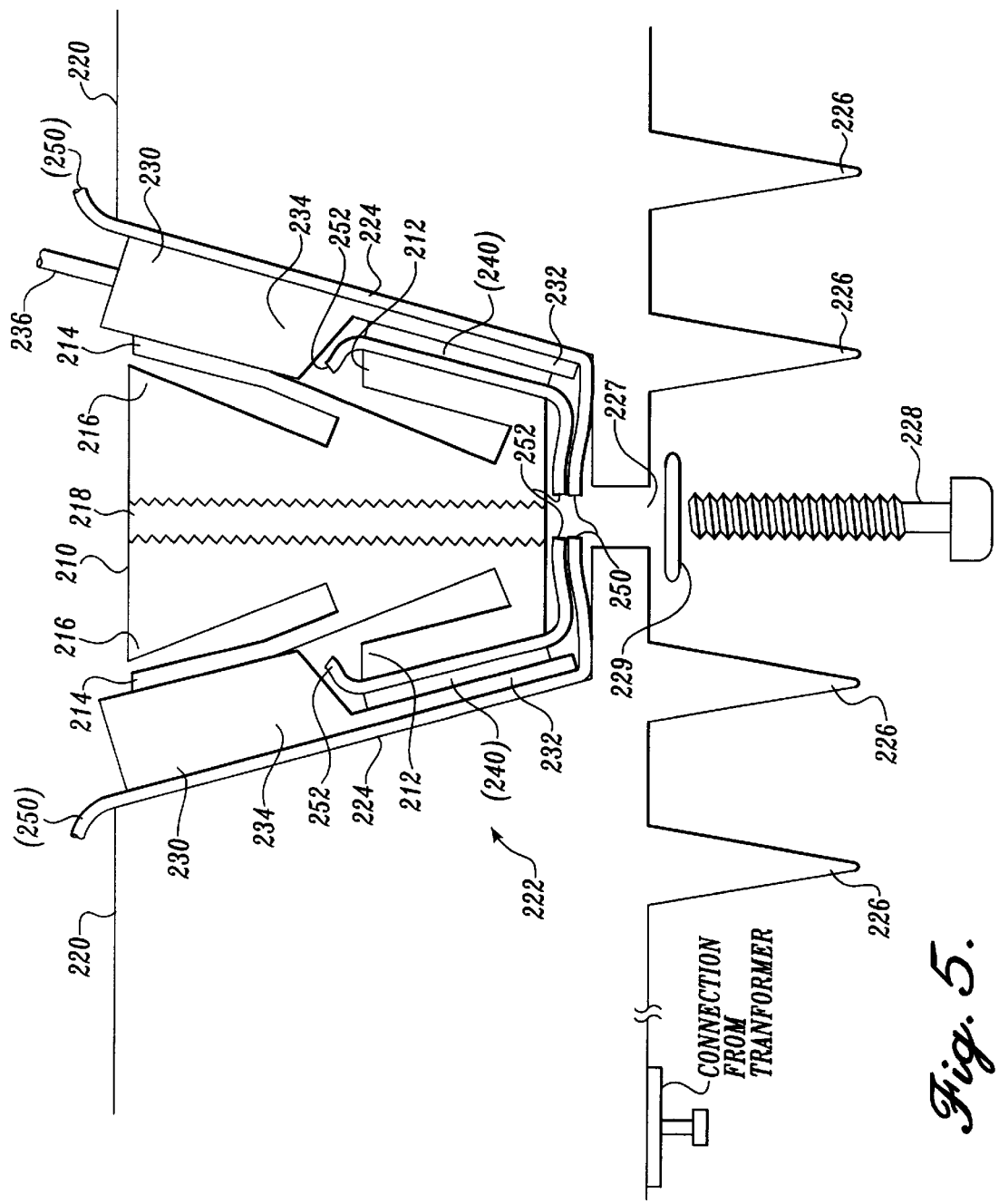
FIG. 5 is a side cut-away view of a transistor heat sink and a wedge of FIG. 4.

Shown in FIG. 4 is a mounting wedge 210 that includes plate-like sections 212 and 214 that are spaced apart in substantially parallel relationship with one another and extend angularly upward from each side of a base region 213. The central portion of wedge 210 extends upwardly between the inner faces of plate-like sections 214 and includes boundary faces 216 that are spaced apart from and substantially parallel to the inner faces of plate-like sections 214. Located in a substantially rectangular upper face of the wedge 210 is a threaded opening 218. The plate-like sections 212 and 214 are somewhat flexible so as to allow for slight inward bending. As illustrated in FIG. 5, the wedge 210 is configured for insertion into a groove 222 that is formed in a heat sink 220. The groove 222 includes upwardly angularly extending side walls 224. The heat sink 220 also includes cooling fins 226 and a hole 227 for receiving a bolt 228 and washer 229.

As can be seen in FIG. 5, when the wedge 210 is placed in groove 222 of heat sink 220, transistors 230 are positioned between the outer surfaces of plate-like sections 212 and side walls 224 of groove 222. When the wedge 210 is inserted into the groove 222 and drawn downwardly by tightening bolt 228, the wedge 210 urges each transistor 230 against a side wall 224 of the groove 222. In the depicted arrangement, each transistor 230 has a conductive tab 232, a body 234, and pins 236. When bolt 228 is tightened, the plate-like section 212 of the wedge 210 presses the tab 232 of the transistor 230 against an adjoining side wall 224 in the heat sink 220. In addition, the plate-like section 214 of the wedge 210 holds the body 234 of the transistor 230 against the adjoining side wall 224 in the heat sink 220 with the pins 236 of the transistor 230 extending upwardly beyond the surface of the heat sink 220.

For purposes of electrical conduction to the tab 232 of each transistor 230, a bus bar 240 can be positioned between the outer face of plate-like section 212 and the tab 232. If needed, an electrically insulating strip of high-thermal conductivity 250 can be placed between the transistor 230 and the heat sink 220, for purposes of electrically insulating the transistor 230 from the heat sink 220, while maintaining thermal conduction. In an embodiment where the tape-like transformer conductors are coupled directly to the heat sink, bus bar 240 and insulating piece 250 are not used. If required, an electrically insulating piece 252 can be placed between the plate-like section 212 and the tab 232 to electrically isolate the wedge 210.

As indicated above, the wedge 210 is secured within the groove 222 of the heat sink 220 through use of the bolt 228. Specifically, the threaded hole 218 in the wedge 210 receives the bolt 228, and provides a means for tightening the wedge 218 into the groove 222. As the wedge 210 is tightened downward, the plate-like sections 212 and 214 press against the tab 232 and body 234 of the transistor 230, so as to securely maintain the transistor 230 in good thermal conduction with the heat sink 220. The transistor 230 is thereby firmly pressed against the heat sink 220 by force along both its tab 232 and its body 234. The plate-like section 232 also ensures that the bus bar 240 is pressed against the tab 232 with enough force to provide good electrical and thermal conduction. Thus, even in situations in which the surfaces of a transistor 230 or the side walls 234 are not entirely flat, the transistor 230 will still be maintained in satisfactory thermal and electrical contact with the heat sink and other associated electrical components.

Figure 6:
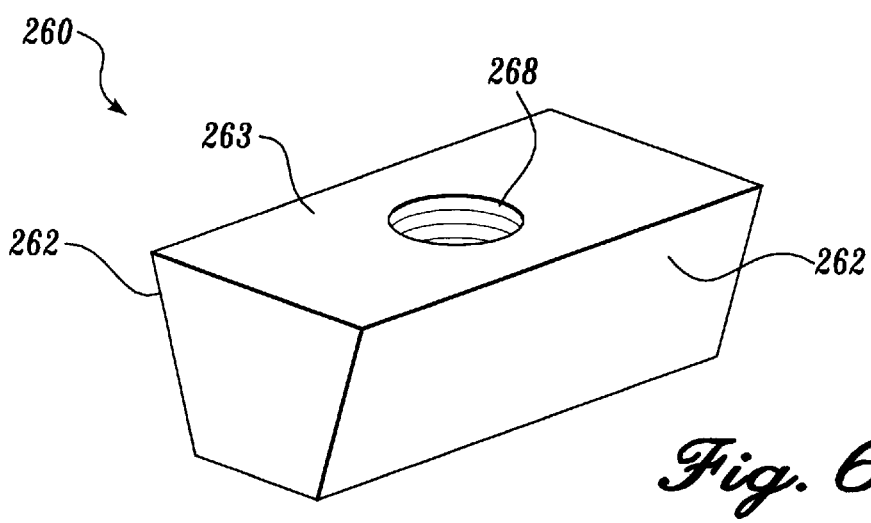
FIG. 6 is a side perspective view of another mounting wedge for use in an alternate embodiment of a heat sink formed in accordance with the present invention.

An alternative embodiment of the invention is shown in FIGS. 6 and 7. Shown in FIG. 6 is a wedge 260 having angularly extending side walls 262 that converge inwardly from a rectangular upper face. A threaded hole 268 is centrally located in upper face 263. The heat sink 270 used with wedge 260 includes a groove 272 for receiving the wedge 260. Heat sink 270 also includes cooling fins 276 for cooling the heat sink 270 and a hole 277 for receiving a bolt 278, which is received in hole 268 of the wedge 260.

The principle of operation for the wedge 260 is similar to that of the operation of the wedge 210, except that only the tab 232 of a transistor 230 (and not the transistor body) is secured within the groove 272 of the heat sink 270. In one embodiment, a bus bar 280 is pressed against the tab 232 for purposes of electrical connection to tab 232 and insulating material 290 (which may be a silicone pad) is included between a sloped surface 274 of the heat sink groove 272 and the tab 232, for purposes of electrical insulation, while still providing thermal conduction. In an embodiment where tape-like transformer conductors are coupled directly to the heat sink, bus bar 280 and insulating material 290 are not used. Insulating material 292 is included next to the side walls 262 of the wedge 260 to insulate the tab 232 from the wedge 260.

As described previously, with respect to the wedge 210, as the wedge 260 is tightened into the notch 272 by the bolt 278, the tabbed section 232 of the transistor 230 is caused to be securely pressed against the sloped surface 274 of the heat sink 270 for purposes of good thermal conduction. In embodiments in which it is employed, the bus bar 280 is also firmly pressed against the tabbed section 232 for purposes of good electrical conduction.

By using a groove with slightly angled side walls in a heat sink in conjunction with a wedge with sides or extended sections cut to a similar angle as the walls, one or two rows of tab style, e.g., TO-220 packages power transistors may be mounted within the notch to provide more than adequate heat transfer and enough pressure to ensure a proper electrical connection. The wedge arrangement of the invention is especially advantageous as some manufacturers recommend 150 to 300 pounds of force to assure proper heat transfer from TO-220 power transistor packages. Further, the wedge may be used to secure from one to four transistors with nearly equal pressure utilizing only a single screw that engages the threaded hole in the wedge, thereby reducing the overall hardware required by previous methods. By inserting suitable insulators and conductors into the groove along with the transistors, the transistors may be operated at a voltage potential that is different from the heat sink or from other transistors mounted to the same heat sink.

The force applied to transistors mounted by wedge arrangement of this inventor can be calculated with a degree of accuracy that is generally satisfactory, by considering the force asserted on the wedge by the machine screw or other type of fastener that is used to secure the wedge, and by the geometry of the wedge. Specifically, the equation relating the amount of torque on the screw to the amount of force applied by the screw is:

$P = T/KD$

Where T=Torque, P=Force, D=Diameter of machine screw or bolt head and K=Constant (0.20 for dry metal).

The equation relating the amount of force applied by the screw to the amount of force applied by the wedge is:

$$Q=P/(2(\mu \cos \alpha+\sin \alpha))$$

Where Q is the force applied by the wedge, $\mu$ is the coefficient of friction for the material being used, and $\alpha$ is the acute angle formed by the wedge faces.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An inverter for converting DC to AC power, comprising:

a transformer with at least one primary winding and at least one secondary winding;

at least one switch coupled to a primary winding of the transformer for periodically interrupting the flow of DC current through the primary winding of the transformer such that a varying current results in the primary winding of the transformer; and a heat sink, at least one of the switches being mounted to the heat sink for dissipating thermal energy generated by the at least one switch, the primary winding of the transformer being directly connected to the heat sink to form an electrical connection that is spatially removed from the location on the heat sink where the at least one switch is mounted such that the heat sink significantly dissipates heat generated at the connection between the primary winding and the heat sink before it reaches the location on the heat sink where the switch is mounted.

2. The inverter of claim 1, wherein the primary windings of the transformer are wound with a tape-like conductor.

3. The inverter of claim 2, wherein the primary winding is directly connected to the heat sink by a fastener that secures a flat section of the tape-like conductor of the primary winding to a substantially flat surface on the heat sink.

4. An inverter for converting DC to AC power, comprising:

a transformer with primary and secondary windings;

a switch for completing a circuit path between a primary winding of the transformer and a DC current source; and a heat sink coupled between said primary winding of the transformer and said switch, the heat sink having a plurality of cooling fins, the primary winding being connected to the heat sink at a connection point on a first one of said cooling fins, said switch being mounted in electrical connection with a second one of said cooling fins, said first and second ones of said cooling fins being separated by at least one additional cooling fin of said plurality of cooling fins.

5. The inverter of claim 4, wherein the primary winding of the transformer is wound with a tape-like conductor.

6. The inverter of claim 5, wherein the primary winding is directly connected to the heat sink by using a fastener to secure a flat section of the tape-like conductor of the primary winding to a substantially flat surface on the heat sink.

7. An inverter for converting DC power to AC power, comprising:

a transformer with primary and secondary windings;

a switch for periodically completing a circuit path between a primary winding of the transformer and a DC current source; and a heat sink, said primary winding being directly connected to the heat sink, said switch being mounted in thermal and electrical contact with the heat sink at a switch mounting location that spatially separates the connection between said primary winding and the heat sink from said switch mounting location by a distance that provides thermal isolation from heat generated by said switch and establishes sufficient cooling capabilities such that the heat generated at the connection between the primary winding and the heat sink is substantially dissipated before it reaches the switch mounting location.

8. The inverter of claim 7, wherein the primary winding is wound with tape wire.

9. A heat sink for an inverter for converting DC power to AC power, comprising:

a groove for receiving a wedge; and a wedge with first and second flexible plate-like sections, the wedge being secured within the groove of the heat sink so as to fixably hold a transistor with a tab and body against the heat sink, the first plate-like section pressing the transistor tab against the heat sink and the second plate-like section pressing the transistor body against the heat sink.

10. The heat sink of claim 9, wherein the first plate-like section presses against the tab of the transistor with a sufficient force to allow good electrical conduction to the tab of the transistor.

11. An invter for converting DC to AC power, comprising:

a transformer with at least one primary winding that is wound from a tape-like conductor;

a switch coupled to the primary winding of the transformer for periodically altering the flow of current through the primary winding of the transformer;

a heat sink, said switch being mounted to the heat sink for dissipating thermal energy generated by said switch, the primary winding of the transformer being directly connected to the heat sink to form an electrical connection that is spatially removed from the location on the heat sink where said switch is mounted such that the heat sink significantly dissipates heat generated at the connection between the primary winding and the heat sink.

12. The inverter of claim 11, wherein the primary winding of transformer include two windings connected to one another to define a primary winding having a center tap, the center tap thereby including at least two tape-like conductors of the primary windings, the two tape-like conductors being electrically connected to the terminal of the DC source through the use of a single connector without requiring the use of an intermediate terminal or lug.

13. The inverter of claim 11, wherein the primary winding is directly connected to the heat sink by a fastener to electrically interconnect a flat section of the tape-like conductor of the primary winding with a substantially flat surface on the heat sink.

14. The inverter of claim 11, wherein the heat sink includes a groove and a wedge shaped for positioning within the groove, said wedge having at least first and second plate-like sections, the switch being mounted to the heat sink by the wedge with the first plate-like section pressing the body of the switch against a boundary wall of the heat sink groove and the second plate-like section pressing the tab of the switch against a body wall of the heat sink groove.

15. An inverter for converting DC to AC power, comprising:

a transformer with at least one primary winding and at least one secondary winding;

at least one switch coupled to a primary winding of the transformer for periodically interrupting the flow of DC current through the primary winding of the transformer such that a varying current results in the primary winding of the transformer; and a heat sink, the at least one switch being mounted in both electrical connection and thermal conduction with the heat sink at a first location for dissipating thermal energy generated by the at least one switch, the primary winding of the transformer being electrically connected and in thermal conduction at a second location of the heat sink that is spatially removed from the first location such that the heat sink significantly dissipates heat generated by the at least one switch and heat generated at the connection between the primary winding and the heat sink.

16. The inverter of claim 15, wherein the primary winding of the transformer is thermally coupled to the second coupling location on the heat sink such that heat from the transformer is primarily dissipated by thermal conduction.

17. The inverter of claim 15, wherein the heat sink has opposite ends, the first and second locations being approximately on opposite ends of the heat sink.

18. The inverter of claim 15, wherein the heat sink comprises a a plurality of substantially parallel spaced-apart cooling fills, a substantial percentage of the cooling-fins being located between the first location and the second location.

19. The inverter of claim 15, wherein the transformer, the at least one switch, and the heat sink are designed with sufficient power capability to be able to convert at least an approximately 12 volt, 100-amp DC current into an approximately 120 volt AC output.

* * * * *

UNITED STATES PATENT AND TRADEMARK OFFICE
CERTIFICATE OF CORRECTION

PATENT NO. : 6,038,156
DATED : March 14, 2000
INVENTOR(S) : H. Inam et al.

It is certified that error appears in the above-identified patent and that said Letters Patent is hereby corrected as shown below:

COLUMN  LINE

10  27  "invter" should read --inverter--
(Claim 11, line 1)

12  8  "fills," should read --fins,--
(Claim 18, line 3)

12  8  "cooling-fins" should read --cooling fins--
(Claim 18, line 3)

Signed and Sealed this

Third Day of April, 2001

Attest:

NICHOLAS P. GODICI

Attesting Officer    Acting Director of the United States Patent and Trademark Office